United States Patent
Fornara et al.

(10) Patent No.: US 10,388,695 B2
(45) Date of Patent: Aug. 20, 2019

(54) METHOD OF WIRELESS COMMUNICATION BETWEEN TWO DEVICES, ESPECIALLY WITHIN ONE AND THE SAME INTEGRATED CIRCUIT, AND CORRESPONDING SYSTEM

(71) Applicant: STMicroelectronics (Rousset) SAS, Rousset (FR)

(72) Inventors: Pascal Fornara, Pourrieres (FR); Christian Rivero, Rousset (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 370 days.

(21) Appl. No.: 13/659,622

(22) Filed: Oct. 24, 2012

(65) Prior Publication Data

US 2013/0104950 A1    May 2, 2013

(30) Foreign Application Priority Data

Oct. 26, 2011    (FR) .................................... 11 59718

(51) Int. Cl.
  *H01L 27/16*    (2006.01)
  *H01L 35/02*    (2006.01)
  (Continued)

(52) U.S. Cl.
  CPC .............. *H01L 27/16* (2013.01); *H01L 23/38* (2013.01); *H01L 35/02* (2013.01); *H01L 35/34* (2013.01);
  (Continued)

(58) Field of Classification Search
  CPC .................................. H01L 27/16; H01L 23/38
  See application file for complete search history.

(56) References Cited

U.S. PATENT DOCUMENTS 5,637,921 A    6/1997    Burward-Hoy
6,127,619 A *  10/2000    Xi et al. ................. 136/203
(Continued)

FOREIGN PATENT DOCUMENTS

| FR | 2946460 A1 | 12/2010 |
| WO | 2010010520 A2 | 1/2010 |
| WO | 2011012586 A1 | 2/2011 |

OTHER PUBLICATIONS

Kao, P. et al., "Fabrication and Characterization of CMOS-MEMS Thermoelectric Micro Generators," Sensors, 10, 1315-1325; doi 10.3390/s 100201315; www.mdpi.com/journal/sensors, Feb. 9, 2010, 11 pp.

(Continued)

*Primary Examiner* — Eli S Mekhlin
(74) *Attorney, Agent, or Firm* — Slater Matsil, LLP (57) ABSTRACT

Method of wireless communication between a first device and a second device, in which, the first device and the second device comprising respectively a first thermoelectric generator and a second thermoelectric generator, the two thermoelectric generators being in thermal coupling, a first signal is generated within the first device, the first thermoelectric generator is electrically powered as a function of the first signal so as to create a first thermal gradient in the said first generator and a second thermal gradient in the second generator, and a second signal is generated within the second device on the basis of the electrical energy produced by the second thermoelectric generator in response to the said second thermal gradient.

20 Claims, 7 Drawing Sheets

(51) Int. Cl.
*H01L 23/38* (2006.01)
*H01L 35/34* (2006.01)
(52) U.S. Cl.
CPC ............... *H01L 2224/16225* (2013.01); *H01L 2924/1461* (2013.01); *H01L 2924/15311* (2013.01)

(56) References Cited

U.S. PATENT DOCUMENTS

| | | | |
|---|---|---|---|
| 8,941,205 B2 | 1/2015 | Rivero et al. | |
| 2002/0134419 A1 | 9/2002 | Macris | |
| 2003/0195408 A1 | 10/2003 | Hastings | |
| 2004/0145049 A1* | 7/2004 | McKinnell et al. | 257/719 |
| 2005/0121064 A1* | 6/2005 | Seo | 136/200 |
| 2007/0095381 A1* | 5/2007 | Lee | 136/230 |
| 2007/0267740 A1 | 11/2007 | Khan et al. | |
| 2008/0136272 A1 | 6/2008 | Ishikawa | |
| 2009/0293928 A1* | 12/2009 | Liang et al. | 136/201 |
| 2010/0239049 A1* | 9/2010 | Horisaki | 375/316 |
| 2010/0259327 A1* | 10/2010 | Hou | 330/129 |

OTHER PUBLICATIONS

Huesgen, T. et al., "Design and Fabrication of MEMS Thermoelectric Generators with High Temperature Efficiency," ScienceDirect, www.sciencedirect.com, Sensors and Actuators A, 145-146, 2008, 423-429, Jun. 28, 2007.
Lhermet, H. et al., "Efficient Power Management Circuit: From Thermal Energy Harvesting to Above-IC Microbattery Energy Storage," IEEE Journal of Solid-State Circuits, vol. 43, No. 1, Jan. 2008, 10 pp.
Koester, D. et al., "Embedded Thermoelectric Coolers for Semiconductor Hot Spot Cooling," IEEE, May 30 2006-Jun. 2 2006, 6 pp.
Ohta, H. et al., Critical Thickness for Giant Thermoelectric Seebeck Coefficient of 2DEG Confined in $SrTiO_3/SrTi_{0.8}Nb_{0.2}O_3$ Superlattices, ScienceDirect, Thin Solid Films 516, www.sciencedirect.com, Oct. 13, 2007, 5 pp.
Vullers, R. et al., "Micropower Energy Harvesting," www.elsevier.com/locate/sse, Solid State Electronics, 53, Apr. 25, 2009, 10 pp.
Wang, Z. et al., "Realization of a Wearable Miniaturized Thermoelectric Generator for Human Body Applications," Sensors and Actuators A: Physical, 156, www.elsevier.com/locate/sna, Mar. 2009, 8 pp.
Carmo, J. et al., "A Planar Thermoelectric Power Generator for Integration in Wearable Microsystems," Sensors and Actuators A: Physical, 161, May 26, 2010, 6 pp.
Yang, S. et al., "Development of a Thermoelectric Energy Harvester with Thermal Isolation Cavity by Standard CMOS Process," Jun. 17, 2009, 7 pp.
Yang, S. et al., "Design and Verification of a Thermoelectric Energy Harvester with Stacked Polysilicon Thermocouples by CMOS Process," Sensors and Actuators A: Physical, 157, Dec. 2009, 9 pp.

* cited by examiner

METHOD OF WIRELESS COMMUNICATION BETWEEN TWO DEVICES, ESPECIALLY WITHIN ONE AND THE SAME INTEGRATED CIRCUIT, AND CORRESPONDING SYSTEM

This application claims the benefit of French Application No. 1159718, filed on Oct. 26, 2011, entitled "Method of Wireless Communication between Two Devices, Especially within one and the same Integrated Circuit, and Corresponding System," which application is hereby incorporated herein by reference.

TECHNICAL FIELD

The invention relates to microelectronics, and more particularly to wireless communication between two devices, most particularly but not exclusively when these two devices are incorporated within one and the same integrated circuit, or else within a three-dimensional integrated structure.

BACKGROUND

Currently, the solution commonly used for the communication of data between two devices inside one and the same electronic chip is based on radiofrequency transmission. However, such solutions are expensive to implement, since they require the introduction of radiofrequency antennas into the chip.

SUMMARY OF THE INVENTION

In one aspect, embodiments of the present invention provide for a method of wireless communication between a first device and a second device, in which, the first device and the second device comprising respectively a first thermoelectric generator and a second thermoelectric generator, the two thermoelectric generators configured to be thermally coupled. The method includes generating a first signal within the first device, and electrically powering the first thermoelectric generator as a function of the first signal so as to create a first thermal gradient in the first generator. The method further includes generating a second thermal gradient in the second generator, and generating a second signal within the second device on the basis of the electrical energy produced by the second thermoelectric generator in response to the second thermal gradient.

In another aspect, embodiments of the present invention provide for a wireless communication system. The wireless communication system includes a first device comprising a first thermoelectric generator, first generating means configured to generate a first signal, and power supply means configured to electrically power the first thermoelectric generator as a function of the first signal so as to generate a first thermal gradient in the first thermoelectric generator. The system further includes a second device including a second thermoelectric generator configured to be thermally coupled with the first thermoelectric generator, delivery means configured to deliver an electrical information cue in response to a second thermal gradient generated in the second thermoelectric generator on the basis of the first thermal gradient, and second generating means configured to generate a second signal as a function of the said electrical information cue.

In yet another aspect, embodiments of the present invention provide for a method comprising receiving an electrical signal having one of a first state and a second state, and generating a first thermal gradient in a first thermocouple in response to the electrical signal being in the first state. The method further includes generating a second thermal gradient in a second thermocouple caused by the first thermal gradient in the first thermocouple, and generating a second electrical signal caused by the second thermal gradient.

BRIEF DESCRIPTION OF THE DRAWINGS

Other advantages and characteristics of the invention will become apparent on reading the detailed description of wholly non-limiting modes of implementation and embodiments, and the appended drawings in which.

DETAILED DESCRIPTION OF ILLUSTRATIVE EMBODIMENTS

Before addressing the illustrated embodiments in detail, various embodiments and advantageous features thereof are discussed generally in the following paragraphs.

According to one mode of implementation, there is proposed a totally new method of wireless communication between two devices, in particular when these two devices are disposed inside one and the same electronic chip.

According to one mode of implementation and embodiment, it is proposed to insert a thermoelectric generator into each device, and to use for one, the Peltier effect and for the other, the Seebeck effect, to allow the wireless transmission of information between the two devices.

According to one aspect, there is proposed a method of wireless communication between a first device and a second device, the first device and the second device comprising respectively a first thermoelectric generator and a second thermoelectric generator, the two thermoelectric generators being in thermal coupling; a first signal is generated within the first device, the first thermoelectric generator is electrically powered as a function of the first signal so as to create a first thermal gradient in the first generator, and a second thermal gradient in the second generator, and a second signal is generated within the second device on the basis of the electrical energy produced by the second thermoelectric generator in response to the said second thermal gradient.

The two thermoelectronic generators may be placed in thermal coupling by for example disposing the two thermoelectric generators one alongside the other or else, at least in part one above the other.

It is possible to incorporate the first device and the second device within one and the same integrated circuit, or else within a three-dimensional integrated structure and more particularly within the linking device (or "interposer", according to an English term well known to the person skilled in the art) between the elements of the structure.

A particularly simple to implement but nonlimiting application of the method consists of the transmission of a logic information cue ("0" or "1") between the two devices.

More precisely, according to one mode of implementation in which the first signal is a first logic signal capable of taking a first logic state and a second logic state, and the second signal is a second logic signal capable of taking the first logic state and the second logic state, the first generator is electrically powered in the presence of the first logic signal having the first logic state, and the second logic signal having the first logic state is generated in the presence of the electrical energy produced by the second thermoelectric generator, while the second logic signal having the second logic state is generated in the absence of electrical energy produced by the second thermoelectric generator.

According to another aspect, there is proposed a wireless communication system, comprising a first device comprising a first thermoelectric generator, first generating means configured to generate a first signal, power supply means configured to electrically power the first thermoelectric generator as a function of the first signal so as to generate a first thermal gradient in the first thermoelectric generator, a second device comprising a second thermoelectric generator in thermal coupling with the first thermoelectric generator, delivery means configured to deliver an electrical information cue in response to a second thermal gradient generated in the second thermoelectric generator on the basis of the first thermal gradient, second generating means configured to generate a second signal as a function of the said electrical information cue.

Although all types of thermoelectric generators are suitable, it is particularly beneficial to use a thermoelectric generator which is compatible with the technologies and methods of fabrication already widely used in the field of microelectronics, in particular for the fabrication of embedded nonvolatile memories ("Embedded Memory") according to the denomination well known to the person skilled in the art, that is to say memories which are manufactured on the same integrated circuit as that containing another component, for example a processor, as opposed to external memory modules which are manufactured on an external specific integrated circuit different from that containing a processor.

It is in particular proposed to use already available layers of material, for example polysilicon, to manufacture the memory cells, and to do so without it being necessary to supplement the generator with additional masks or additional method steps with respect to the method for fabricating existing memory cells, or being necessary at the very least to supplement it with a few additional method steps which are particularly simple to implement.

Thus, when the two thermoelectric generators are disposed one alongside the other, provision may be made, according to one embodiment, for each thermoelectric generator to comprise a semiconducting substrate and parallel isolating regions, at least one set of thermocouples connected electrically in series and connected thermally in parallel, the said at least one set of thermocouples being situated in the substrate and comprising parallel semiconducting regions extending in the substrate, two neighbouring semiconducting regions having respectively one and the other of two opposite types of conductivity and being separated by an isolating region.

As a variant, according to another embodiment, still compatible with a placement one alongside the other of the two thermoelectric generators, each thermoelectric generator comprises a semiconducting substrate covered with an isolating layer, at least one set of thermocouples connected electrically in series and connected thermally in parallel comprising several parallel pairs of parallel semiconducting regions shrouded in an isolating material having respectively two opposite types of conductivity.

As a variant, the two thermoelectric generators may be disposed at least in part one above the other. And, according to one embodiment compatible with such a placement, one of the thermoelectric generators comprises a semiconducting substrate and parallel isolating regions, a set of thermocouples connected electrically in series and connected thermally in parallel, the said set of thermocouples being situated in the substrate and comprising parallel semiconducting regions extending in the substrate, two neighbouring semiconducting regions having respectively one and the other two opposite types of conductivity and being separated by an isolating region, and the other thermoelectric generator comprises the substrate and the parallel isolating regions and a set of thermocouples connected electrically in series and connected thermally in parallel, the said set of thermocouples comprising above each isolating region at least one pair of semiconducting regions shrouded in an isolating material having respectively two opposite types of conductivity.

Whatever the configuration, each thermoelectric generator furthermore comprises for example electrically conducting connection means ensuring the electrical link between the semiconducting regions of the set of thermocouples, these connection means being situated above the substrate and linking an end zone of a semiconducting region having one of the two types of conductivity to an end zone of a semiconducting region having the other type of conductivity.

According to one embodiment, the first signal being a first logic signal capable of taking a first logic state and a second logic state and the second signal being a second logic signal capable of taking the first logic state and the second logic state, the power supply means are configured to electrically power the first generator in the presence of the first logic signal having the first logic state, and the second generating means are configured to generate the second logic signal having the first logic state in the presence of the electrical information cue produced by the said delivery means and to generate the second logic signal having the second logic state in the absence of electrical information cue produced by the said delivery means.

According to another aspect, there is proposed an integrated circuit incorporating the system such as defined hereinabove.

According to another aspect, there is proposed a three-dimensional integrated structure comprising at least two elements electrically interconnected by a linking device, and furthermore incorporating the system such as defined hereinabove, this system possibly being for example at least in part incorporated in the linking device of the three-dimensional integrated structure.

Figure 1:
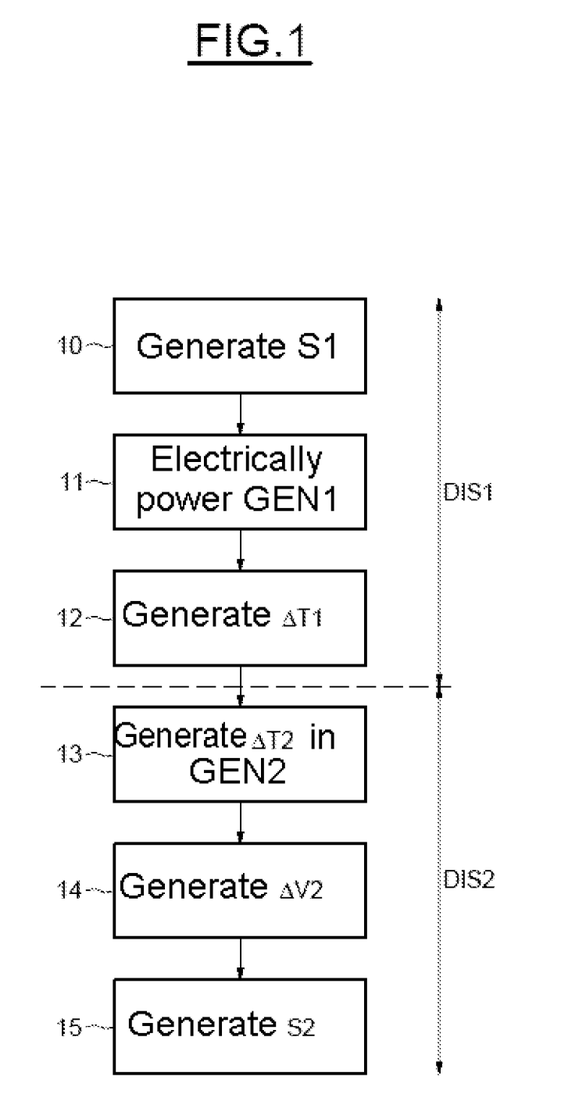
FIG. 1 schematically illustrates an exemplary implementation of a method according to the invention, FIGS. 2 to 4 schematically illustrate embodiments of a system according to the invention.

In FIG. 1, two devices DIS1 and DIS2 each comprise a thermoelectric generator GEN1 and GEN2 (see, e.g., FIG. 2) disposed relatively to one another in thermal coupling. A first signal S1 is generated (10) within the first device and the first thermoelectric generator GEN1 is electrically powered (11) as a function of the first signal. Stated otherwise, the value of the current or of the voltage delivered at the terminals of the generator GEN1 depends on the value of the first signal S1. Consequently, on account of the Peltier effect, the electrical powering of the first generator GEN1 generates, in this generator, a first thermal gradient $\Delta T1$ (12).

While the two generators GEN1 and GEN2 are in thermal coupling, this first thermal gradient $\Delta T1$ generates (13) in the generator GEN2, a second thermal gradient $\Delta T2$. On account of the Seebeck effect, this second thermal gradient ΔT2 generates, at the terminals of the second thermoelectric generator GEN2, electrical energy, for example a potential difference ΔV2 (14). A second signal S2 is then generated (15) in response to the said electrical energy produced.

Stated otherwise, the value of the signal S2 depends on the value of the electrical energy produced, for example the value of the potential difference ΔV2. A wireless communication is thus established between the device DIS1 and DIS2.

Figure 2:
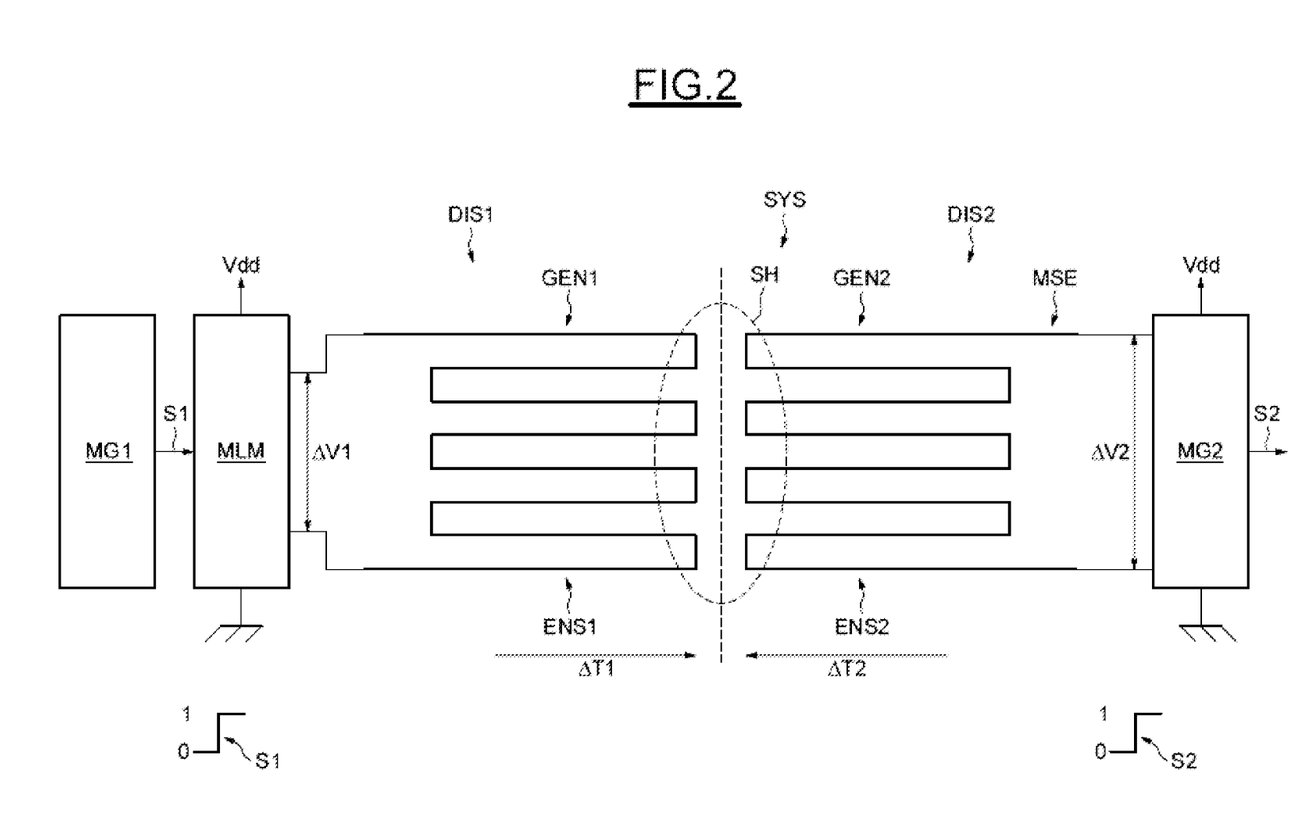

FIG. 2 illustrates very schematically an exemplary embodiment of a system SYS for wireless communication between the two devices DIS1 and DIS2, allowing especially the implementation of the method described in FIG. 1.

More precisely, the first device DIS1 comprises the first generator GEN1, first generating means MG1 configured to generate a first signal S1, power supply means MLM connected between a supply voltage Vdd and earth, and configured to electrically power the first thermoelectric generator GEN1 as a function of the first signal S1 so as to generate the first thermal gradient ΔT1 in the first thermoelectric generator.

In this regard, the power supply means MLM can generate a potential difference ΔV1 across the terminals of the generator GEN1, thus causing a current I1 to flow in this generator GEN1.

On account of the Peltier effect, the flow of the current I1 in the generator GEN1 will create the temperature gradient ΔT1 as well as a hot zone SH at an end of this first generator GEN1.

The second generator GEN2 of the device DIS12 being in thermal coupling with the first generator GEN1, an end of this second generator GEN2 is situated in the hot zone SH. And, as the other end is at a lower temperature, a second thermal gradient ΔT2 is therefore created in this second generator GEN2, thereby making it possible to produce as output from this generator a corresponding electrical information cue, for example a potential difference ΔV2.

The second device DIS2 then comprises delivery means MSE configured to deliver this electrical information cue to second generating means MG2 also connected between the supply voltage Vdd and earth. These second generating means MG2 are configured to generate a second signal S2 as a function of the said electrical information cue ΔV2.

By way of indication, the means MSE may be for example quite simply metallic tracks, or, when the thermoelectric generator GEN2 comprises bars (as will be seen in greater detail hereinafter), a corresponding prolongation of the bars.

In a particular example, the first generating means MG1 can comprise logic means configured to generate a first logic signal S1 liable to take a first logic state, for example the logic state "1", or else a second logic state, for example the logic state "0". The power supply means MLM will then electrically power the first generator GEN1 when the first logic signal S1 has the value 1, and will not power it in the converse case. Consequently, the two thermal gradients ΔT1 and ΔT2 will be generated only in the presence of a logic signal S1 having the value 1.

The second generating means MG2 are also configured, to deliver as signal S2, a logic signal capable of also taking the value "0" or the value "1". In this regard, the second means MG2 can also comprise logic circuits. And, in the presence of a nonzero potential difference ΔV2, the second means MG2 will deliver a logic signal S2 having the logic value 1, while in the presence of a zero potential difference ΔV2, the means MG2 will deliver a logic signal S2 having the logic value "0". Consequently, here the system SYS therefore readily allows the transmission of a logic information cue "0" or "1" between the two devices.

By way of example, the signal S1 may be a control signal for activating a specific block of the device DIS2. And, this specific block will be activated in response to the signal S2 having the logic value "1".

Any type of thermoelectric generator is suitable for the application of the invention. That said, thermoelectric generators comprise, in a conventional manner, a support and a set of thermocouples connected electrically in series and connected thermally in parallel. Thermocouples connected thermally in parallel are understood as being thermocouples intended to all be subjected to one and the same temperature gradient, for example when a heat source is disposed at one of the ends of the thermocouples, and when a cold source is disposed at the other end. A potential difference which is due to the Seebeck effect is then created at the two terminals of the set of thermocouples linked electrically in series.

Thermoelectric generators have formed the subject of numerous publications. Mention may especially be made of the article by Vullers et al., entitled "Micropower energy harvesting", Solid-State Electronics 53 (2009) 684-693, the article by Yang et al., entitled "Design and verification of a thermoelectric energy harvester with stacked polysilicon thermocouples by CMOS process", Sensors and actuators A157 (2010) 258-266, the article by Pin-Hsu Kao et al., entitled Fabrication and Characterization of CMOS-MEMS Thermoelectric Micro Generators, Sensors 2010, 10, 1315-1325, the article by Joao Paulo Carmo et al., entitled "A planar thermoelectric power generator for integration in wearable microsystems", Sensors and Actuators A161 (2010), 199-204, the article by S. M. Yang et al., entitled "Development of a thermoelectric energy harvester with thermal isolation cavity by standard CMOS process", Sensors and Actuators A153 (2009), 244-250, the article by Ziyang Wang et al., entitled "Realization of a wearable miniaturized thermoelectric generator for human body applications", Sensors and Actuators A156 (2009), 95-102, the article by Hélène Lhermet et al., entitled "Efficient Power Management Circuit: From Thermal Energy Harvesting to Above-IC Microbattery Energy Storage", IEEE Journal of Solid-State Circuits, Vol. 43, No. 1, January 2008, the article by Till Huesgen et al., entitled "Design and fabrication of MEMS thermoelectric generators with high temperature efficiency", Sensors and Actuators A145-146 (2008), 423-429, the article by David Koester et al., entitled "Embedded thermoelectric coolers for semiconductor hot spot cooling", 2006 IEEE, the article by Hiromichi Ohta et al., entitled "Critical thickness for giant thermoelectric Seebeck coefficient of 2DEG confined in SrTiO3/SrTi0.8Nb0.2O3 superlattices", Thin Solid Films 516 (2008), 5916-5920.

All these articles, the relevant teachings of which are incorporated herein by reference, describe either the general principles of thermoelectric generators based on the Seebeck effect, by using for example ceramic supports, or else describe generators using materials that are incompatible with CMOS technologies, such as piezoelectric materials, or else generators based on technological methods of the MEMS type (Micro Electro Mechanical System) and exhibiting cavities in the substrate under the thermocouples.

It is therefore possible to use, for each generator GEN1 and GEN2, one of the generators described in these publications, but without it being necessary to use two identical structures for the two generators.

The first generator GEN1 is based on the Peltier effect, which is the inverse effect of the Seebeck effect, while the second generator GEN2 is based on the Seebeck effect.

Figure 3:
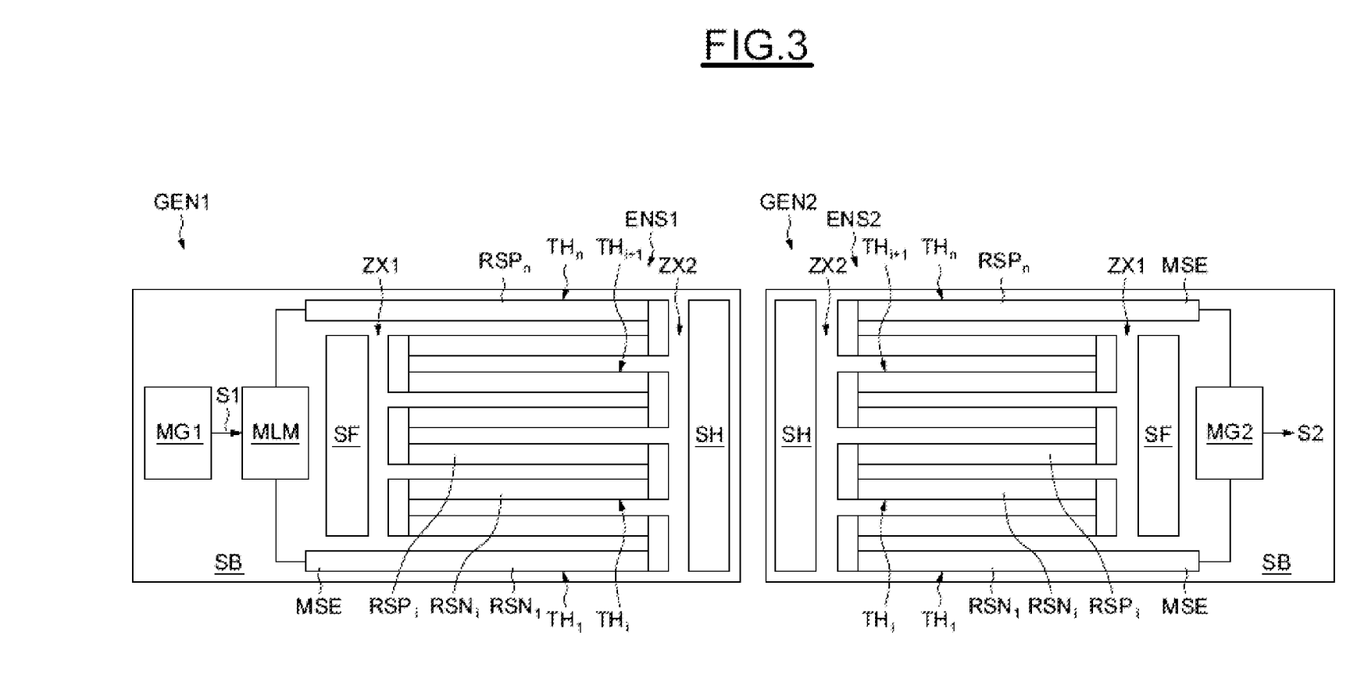

FIG. 3 illustrates in greater detail but still in a schematic manner, an exemplary embodiment of a thermoelectric generator. In this embodiment, the structure of the two generators is identical. For the sake of simplification, only the structure of the generator GEN1 will be described here.

The generator GEN1 is disposed within and/or on a semiconducting substrate SB, of for example silicon, and comprises a set ENS1 of thermocouples THi.

Here, each thermocouple THi comprises a bar-shaped semiconducting region, of N type of conductivity, referenced RSNi, and a semiconducting region of P type of conductivity, referenced RSPi also bar-shaped.

The two semiconducting regions of the thermocouple THi are parallel and linked electrically at one of their ends, and the whole set of thermocouples THi are linked electrically in series so as to form a chain of parallel bars alternately having the N type of conductivity and the P type of conductivity. The flow of a current in the thermocouple set ENS1 creates at the end ZX2 a hot source SH, and at the other end ZX1 a cold source SF.

As regards the second generator GEN2, the hot source SH is also situated at the level of the second end ZX2 of the thermocouple set ENS2, and the cold source at the level of the other end ZX1.

The thermocouples of the set ENS1 are connected thermally in parallel, that is to say they are connected so that they are all subjected together to the same temperature gradient.

In FIG. 3, the thermal coupling between the two generators GEN1 and GEN2 is performed by disposing the two generators side by side.

Figure 4:
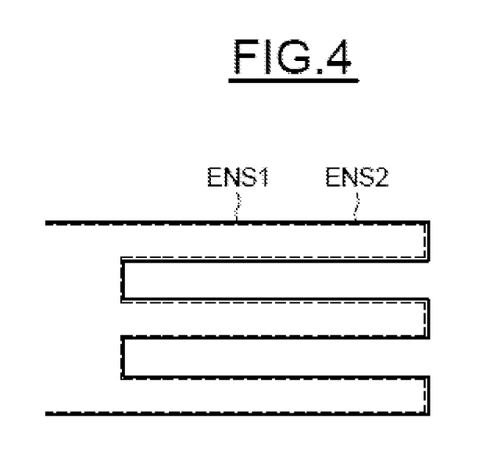

As a variant, it would be possible, as illustrated in FIG. 4, to place the two generators GEN1, GEN2, and more particularly their respective thermocouple sets ENS1 and ENS2, at least in part one above the other.

Figure 5:
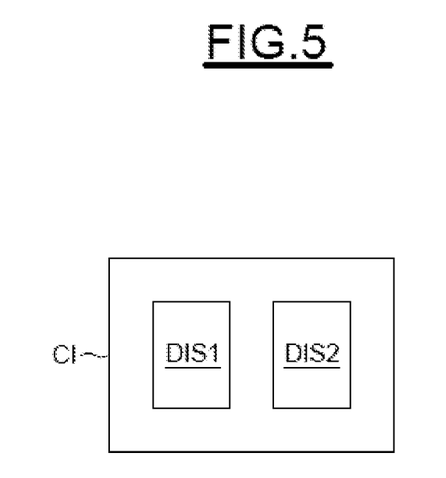
FIG. 5 illustrates very schematically an exemplary embodiment of an integrated circuit incorporating an exemplary system according to the invention.

In a particularly beneficial embodiment, provision is made to dispose the two devices DIS1 and DIS2 within one and the same integrated circuit CI. The devices DIS1 and DIS2 can then comprise different functional blocks of the integrated circuit and intended to communicate one with the other by wireless communication (FIG. 5).

In this case, it is particularly beneficial that each thermoelectric generator be compatible with the technologies and methods of fabrication already widely used in the field of microelectronics, in particular for the fabrication of embedded nonvolatile memories. It is possible in this regard, as will be described hereinafter, to use layers of material, for example polysilicon, already available to manufacture the memory cells.

An embodiment compatible with a conventional method for fabricating an embedded memory, and compatible with a side-by-side placement of the two generators will now be described while referring more particularly to FIG. 6 and FIG. 7.

Here again, the structure of the two generators GEN1 and GEN2 is identical and, for the sake of simplification, only the structure of the generator GEN1 is described here.

Figure 6:
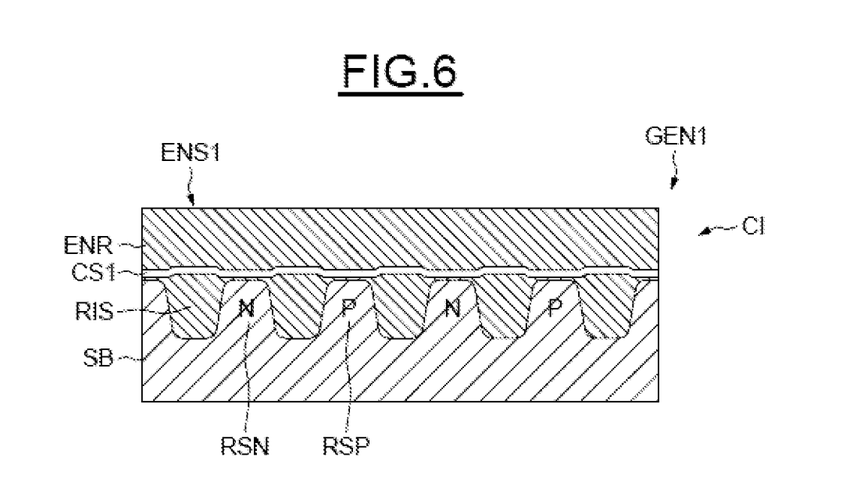
FIGS. 6 to 9 illustrate schematically other embodiments of thermoelectric generators that can be incorporated into embodiments of devices according to the invention, and FIG. 10 schematically illustrates an exemplary embodiment of an integrated structure according to the invention.
Figure 7:
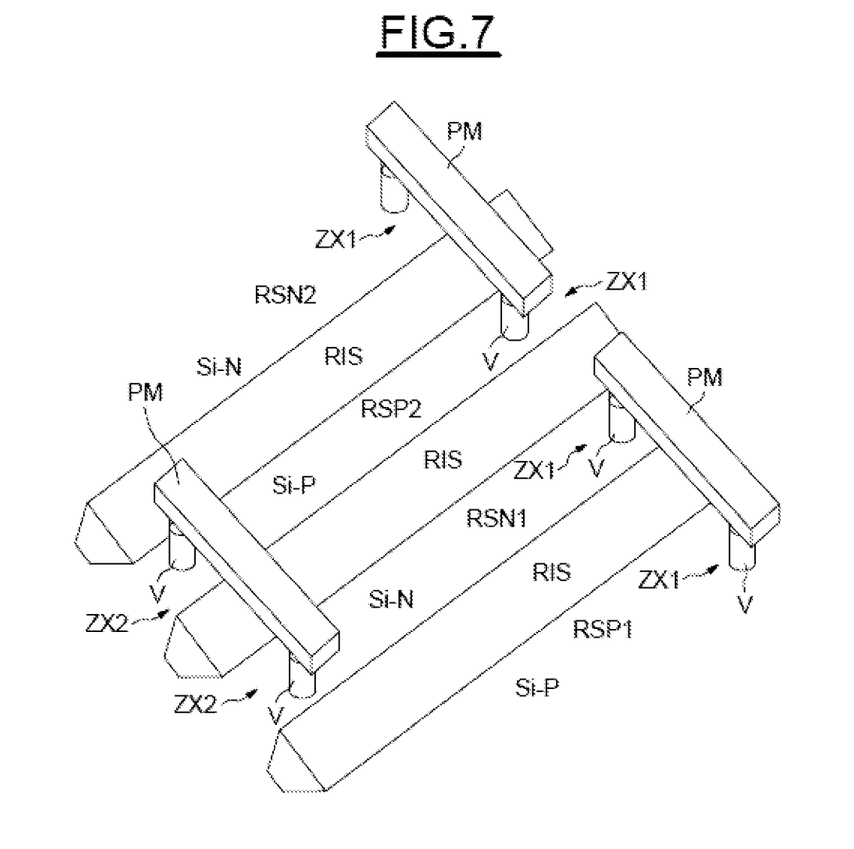

In FIG. 6, the support of the generator GEN (GEN1 or GEN2) comprises a semiconducting substrate SB, of for example silicon, within which are made parallel isolating regions RIS, for example regions of the STI (Shallow Trench Isolation) type.

The set of thermocouples ENS1 is situated in the substrate SB and comprises parallel semiconducting regions RSN, RSP extending in the substrate, two neighbouring semiconducting regions RSN, RSP having respectively one and the other of two types of conductivity, in this instance the N type of conductivity and the P type of conductivity, and are separated by an isolating region RIS.

The whole set is covered by an isolating layer CS1, for example a silicon nitride layer, itself covered with an isolating shroud ENR, of for example silicon dioxide SiO2.

The realization of such a generator is perfectly compatible with the conventional method for fabricating embedded memories, and does not require any modification of method nor any addition of mask level.

The isolating shroud ENR is for example that in which the metallization levels of the integrated circuit are made.

In this regard, and in a general manner, whatever structure of thermocouple set is used, the generator comprises electrically conducting connection means ensuring the electrical link between the semiconducting regions of the thermocouples, these connection means being situated above the substrate and linking an end zone of a semiconducting region having one of the two types of conductivity, for example the N type of conductivity, to an end zone of a semiconducting region having the other type of conductivity, for example the P type of conductivity.

For example, these connection means are shrouded in the isolating material ENR and comprise metallic tracks perpendicular to the semiconducting regions, and connected to the said end zones by vertical electrical links, for example contacts or vias.

And, so as to be compatible with conventional methods for manufacturing components, for example embedded memories, the metallic tracks of the connection means are situated on at least one of the metallization levels of the integrated circuit CI. This is illustrated more particularly in FIG. 7, which shows the means of connection of the generator of FIG. 6.

Thus, the end zone ZX1 of the semiconducting region RSN1 is electrically connected to the homologous end zone ZX1 of the region RSP1 by a metallic track PM straddling the isolating region RIS separating these two regions RSN1 and RST1, this metallic track being linked to the end zones ZX1 by vias V.

Likewise, the end zones ZX2 of the regions RSN1 and RSP2 are also connected together by a metallic track PM straddling the region RIS separating these two regions RSN1 and RSP2. This metallic track PM is connected to the end zones ZX2 by vias V.

Likewise, the two end zones ZX1 of the regions RSP2 and RSN2 are connected in the same manner by a metallic track PM straddling the isolating region RIS, this metallic track being connected to the zones ZX1 by way of vias V.

Figure 8:
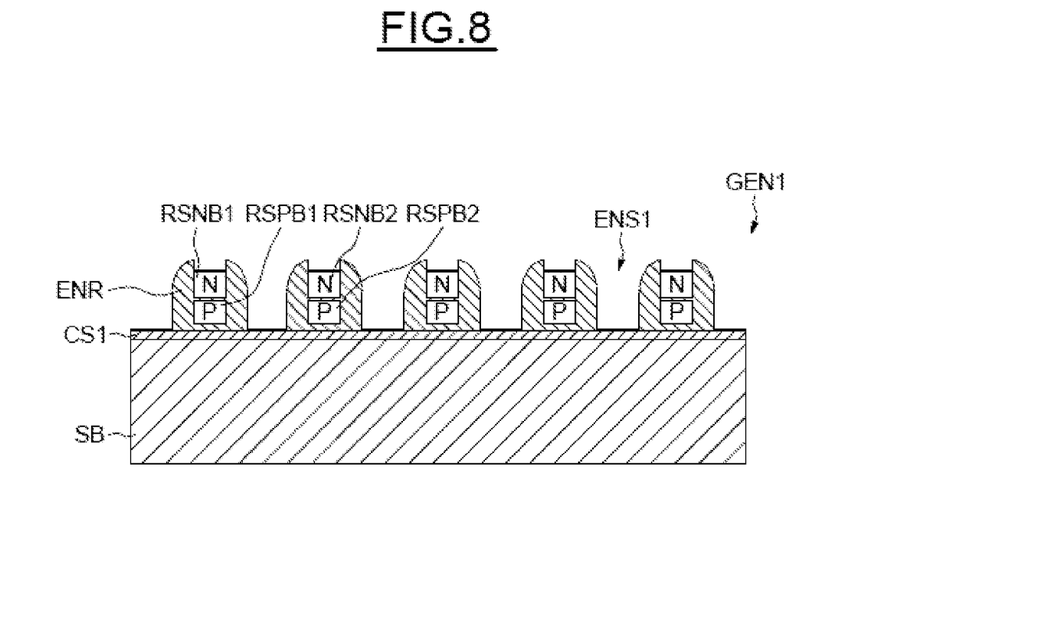

Another embodiment compatible especially with a side-by-side placement of the two generators GEN1 and GEN2 is illustrated in FIG. 8. Here again, the structure of each generator is identical, and only that of the generator GEN1 will be described.

The thermocouple set ENS1 comprises here, above the isolating layer CS1 covering the substrate SB, parallel pairs of parallel semiconducting regions RSPBi and RSNBi shrouded in an isolating material ENR and having respectively the two types of conductivity N and P.

Here again, the generator of FIG. 8 is perfectly compatible with methods for fabricating embedded non-volatile memories.

Figure 9:
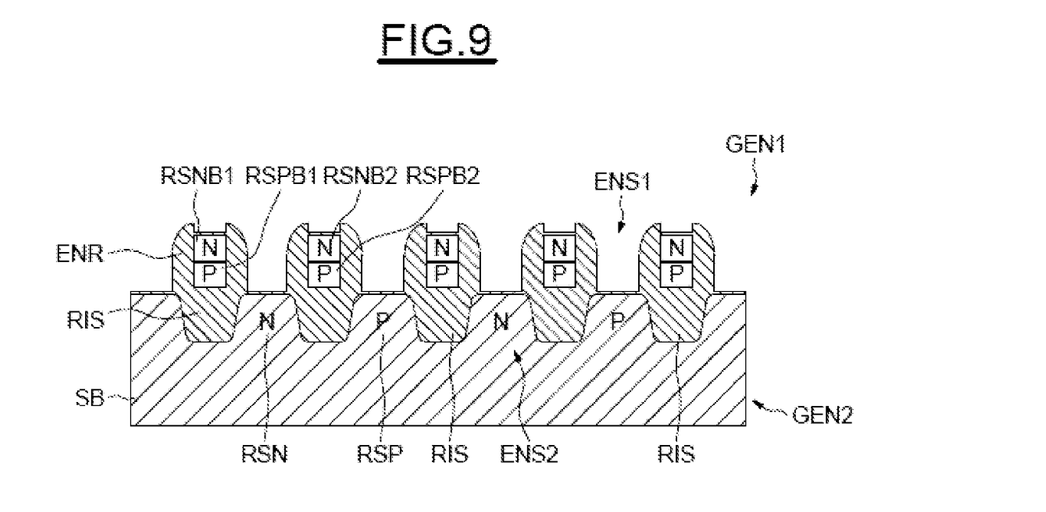

The embodiment of FIG. 9 is compatible with a placement one above the other of the two generators GEN1, GEN2, and is also compatible with a method of fabrication of the embedded memory type.

As may be seen in FIG. 9, the generator GEN1 exhibits a structure analogous to that described with reference to FIG. 8, while the generator GEN2 exhibits a structure analogous to that described with reference to FIG. 6. Of course, the structures of the two generators GEN1 and GEN2 could be reversed.

More precisely, the pairs of semiconducting regions RSPBi and RSNBi of the set ENS1 of the generator GEN1 are this time disposed above the parallel isolating regions RIS made in the substrate SB.

And, the set ENS2 of the generator GEN2 is formed here of the parallel semiconducting regions RSN and RSP respectively disposed between the parallel regions RIS.

Figure 10:
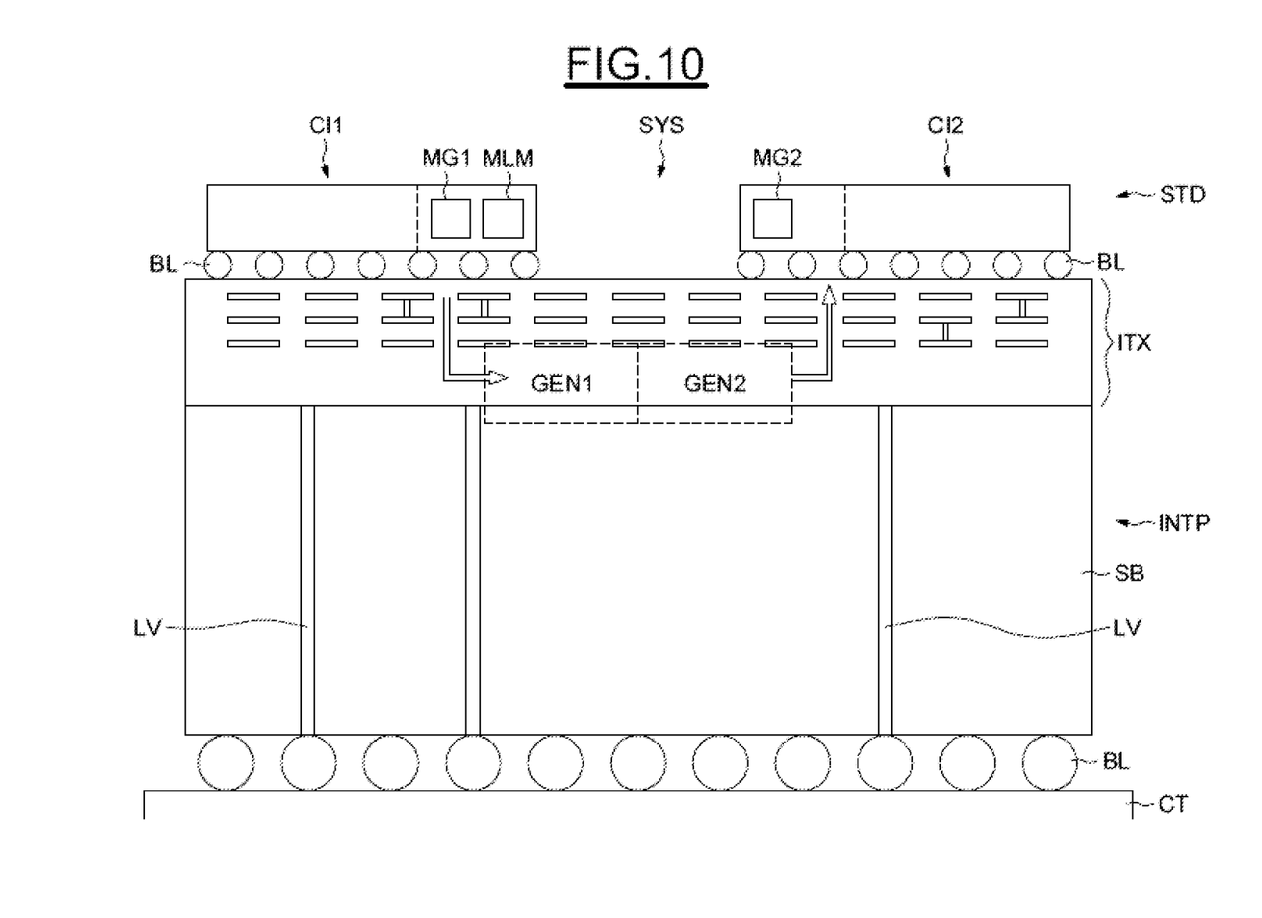

FIG. 10 is now referred to more particularly, to illustrate an embodiment of a three-dimensional integrated structure incorporating a system SYS such as that described for example with reference to the previous figures.

In FIG. 10, the reference STD designates the three-dimensional integrated structure, comprising a linking device or interposer INTP on the upper face of which are connected in this example two integrated circuits CI1 and CI2, for example by way of connection balls BL ("bumps").

Moreover, the integrated structure STD also comprises a third element, namely in this instance an integrated circuit card CT ("Printed Circuit Board": PCB) on which the lower face of the interposer INTP is connected, also by way of connection balls BL.

The interposer INTP comprises a substrate SB, generally of silicon, as well as an interconnection part ITX comprising several metallization levels, within which are manufactured metallic tracks linked together, in the case of some of them, by vias. The whole set of metallic tracks and vias is shrouded in an isolating shroud, of for example silicon dioxide, and makes it possible to ensure, in particular, electrical interconnection between the two integrated circuits CI1 and CI2.

The substrate SB also comprises electrically conducting vertical links LV, manufactured in the form of TSVs ("Through Silicon Vias") and making it possible to link electrically, for example, some of the metallic tracks of the interconnection part ITX with the balls BL so as to ensure a vertical electrical connection between at least one of the integrated circuits CI1 and CI2 with the card CT.

It is proposed here, according to one aspect of the invention, to use the interposer INTP to incorporate therein at least partially a wireless communication system SYS.

More precisely, the system SYS will allow wireless communication between the integrated circuit CI1 and the integrated circuit CI2.

In the example described here, the interposer INTP incorporates the generators GEN1 and GEN2, while the means MG1 and MLM of the device DIS1 are incorporated into the integrated circuit CI1, and the means MG2, which generate the signal S2, are incorporated into the integrated circuit CI2.

The generators GEN1 and GEN2 may be for example those described with reference to FIGS. 6 to 9.

And, so as to be compatible with methods of conventional manufacture of components, for example of embedded memories, the metallic tracks of the connection means ensuring the electrical link between the semiconducting regions of the thermocouples may be situated on at least one of the metallization levels of the interconnection part ITX of the interposer.

What is claimed is:

1. A communication system, comprising:
   a first device comprising a first thermoelectric generator, a first signal generator coupled to the first thermoelectric generator, and a power supply coupled to the first thermoelectric generator, wherein the first thermoelectric generator is electrically powered as a function of a first signal to generate a first thermal gradient in the first thermoelectric generator, wherein the first thermoelectric generator comprises a semiconductor substrate, a plurality of parallel isolating regions, and a first set of thermocouples connected electrically in series and connected thermally in parallel, the first set of thermocouples comprising at least one pair of first semiconducting regions disposed above each isolating region of the plurality of parallel isolating regions, the at least one pair of first semiconducting regions disposed above each isolating region of the plurality of parallel isolating regions being shrouded in an isolating material and having respectively two opposite types of conductivity; and
   a second device comprising a second thermoelectric generator thermally coupled with the first thermoelectric generator, a delivery component configured to deliver an electrical information cue in response to a second thermal gradient generated in the second thermoelectric generator based on the first thermal gradient, and a second signal generator coupled to the delivery component and configured to generate a second signal, wherein the first thermoelectric generator and the second thermoelectric generator are disposed at least in part one above the other, and wherein the second thermoelectric generator comprises the semiconductor substrate, the plurality of parallel isolating regions, and a second set of thermocouples connected electrically in series and connected thermally in parallel, the second set of thermocouples comprise a plurality of parallel second semiconducting regions extending in the semiconductor substrate, and two adjacent second semiconducting regions of the plurality of parallel second semiconducting regions have respectively the two opposite types of conductivity and are separated by an isolating region of the plurality of parallel isolating regions.

2. The system according to claim 1, wherein a plurality of electrical conductors form an electrical link between a first pair of first semiconducting regions of the at least one pair of first semiconducting regions of the first set of thermocouples, the plurality of electrical conductors are situated above the semiconductor substrate, and the plurality of electrical conductors link an end zone of a first semiconducting region of the first pair of first semiconducting regions having one of the two types of conductivity to an end zone of a first semiconducting region of the first pair of semiconducting regions having the other type of conductivity.

3. The system according to claim 1, wherein the first signal is a first logic signal capable of taking a first logic state and a second logic state and the second signal is a second logic signal capable of taking the first logic state and the second logic state, the power supply is configured to electrically power the first signal generator in the presence of the first logic signal having the first logic state, and the second signal generator is configured to generate the second logic signal having the first logic state in the presence of the electrical information cue produced by the delivery component and to generate the second logic signal having the second logic state in the absence of electrical information cue produced by the delivery component.

4. The system according to claim 1, wherein a plurality of electrical conductors form an electrical link between second semiconducting regions of the plurality of parallel second semiconducting regions of the second set of thermocouples, wherein the plurality of electrical conductors are situated above the semiconductor substrate, and the plurality of electrical conductors link an end zone of a second semiconducting region of the plurality of parallel second semiconducting regions having one of the two types of conductivity to an end zone of a second semiconducting region of the plurality of parallel second semiconducting regions having the other type of conductivity.

5. The system according to claim 4, wherein the plurality of electrical conductors are electrically connected to the plurality of parallel second semiconducting regions by a plurality of vias, and wherein a major axis of each of the plurality of vias extends in a direction that is perpendicular to a major surface of the semiconductor substrate.

6. The system according to claim 4, wherein the semiconductor substrate and an interconnect region are comprised in an interposer, and the first signal generator is comprised in a first integrated circuit disposed on the interposer.

7. The system according to claim 6, wherein the second signal generator is comprised in a second integrated circuit disposed on the interposer next to the first integrated circuit.

8. A communication system comprising:
a power supply circuit, configured to electrically power a first thermoelectric generator based on a first signal;
the first thermoelectric generator, configured to transform the first signal into a first thermal gradient, wherein a first integrated circuit comprises a semiconductor substrate and an interconnect region disposed over the semiconductor substrate, the first thermoelectric generator comprises a plurality of first semiconducting regions extending along a surface of the semiconductor substrate, wherein first semiconducting regions of the plurality of first semiconducting regions are electrically interconnected by a plurality of electrical connectors, the plurality of electrical connectors comprises a plurality of metallic tracks and a plurality of vias, wherein each first semiconducting region of the plurality of first semiconducting regions is electrically connected to another first semiconducting region of the plurality of first semiconducting regions by at least two vias of the plurality of vias and at least one metallic track of the plurality of metallic tracks, and wherein a major axis of each of the at least two vias is perpendicular to a major axis of the at least one metallic track of the plurality of metallic tracks;
a second thermoelectric generator thermally coupled with the first thermoelectric generator and configured to generate an intermediate electrical signal based on the first thermal gradient; and
an output signal generation circuit configured to generate a second signal based on the intermediate electrical signal.

9. The communication system of claim 8, wherein the plurality of metallic tracks are disposed in an isolating material.

10. The communication system of claim 8, further comprising:
an input signal generation circuit configured to generate the first signal; and
an electrical signal delivery element configured to provide the intermediate electrical signal to the output signal generation circuit.

11. The system according to claim 10, wherein the first thermoelectric generator and the second thermoelectric generator are disposed one alongside the other in the first integrated circuit.

12. The system according to claim 11, wherein the second thermoelectric generator comprises at least one set of thermocouples connected electrically in series and connected thermally in parallel, the at least one set of thermocouples being situated in the semiconductor substrate and comprising parallel second semiconducting regions extending in the semiconductor substrate, two neighboring second semiconducting regions of the parallel second semiconducting regions having respectively one and the other of two opposite types of conductivity and being separated by an isolating region of parallel isolating regions.

13. The system according to claim 11, wherein the second thermoelectric generator comprises the semiconductor substrate, the semiconductor substrate is covered with an isolating layer, the second thermoelectric generator comprises at least one set of thermocouples connected electrically in series and connected thermally in parallel, wherein the at least one set of thermocouples comprises several parallel pairs of parallel second semiconducting regions shrouded in an isolating material having respectively two opposite types of conductivity.

14. The system according to claim 10, wherein the first thermoelectric generator and the second thermoelectric generator are disposed at least in part one above the other.

15. The system according to claim 14, wherein the second thermoelectric generator comprises the semiconductor substrate and a plurality of parallel isolating regions, a second set of thermocouples connected electrically in series and connected thermally in parallel, the second set of thermocouples being situated in the semiconductor substrate, and the second set of thermocouples comprising parallel second semiconducting regions extending in the semiconductor substrate, two neighboring semiconductor semiconducting regions having respectively one and the other two opposite types of conductivity and being separated by an isolating region of the parallel isolating regions, and
the first thermoelectric generator comprises the parallel isolating regions and a first set of thermocouples connected electrically in series and connected thermally in parallel, the first set of thermocouples comprising the plurality of first semiconducting regions, wherein at least one pair of first semiconducting regions of the plurality of first semiconducting regions is disposed over one of the isolating regions of the parallel isolating regions, is shrouded in an isolating material, and first semiconducting regions of the at least one pair of first semiconducting regions have two opposite types of conductivity.

16. The system according to claim 10, wherein:
the first signal comprises a first logic signal capable of taking a first logic state and a second logic state and the second signal comprises a second logic signal capable of taking the first logic state and the second logic state;
the power supply circuit is configured to electrically power the first thermoelectric generator in the presence of the first logic signal having the first logic state; and
the output signal generation circuit is configured to generate the second logic signal having the first logic state based on a first signal level of the intermediate electrical signal provided by the electrical signal delivery element and to generate the second logic signal having the second logic state based on a second signal level of the intermediate electrical signal provided by the electrical signal delivery element.

17. The system according to claim 6, wherein the first integrated circuit is connected to the interposer by a plurality of connection bumps.

18. A communication system, comprising:
a first integrated circuit, comprising:
   a power supply; and
   a first signal generator, configured to generate a first signal;
a linking device, wherein the first integrated circuit is disposed on the linking device and connected to the linking device by a plurality of connectors, and the linking device comprises:
   a semiconductor substrate;
   an interconnect region disposed over the semiconductor substrate;
   a first thermoelectric generator extending along a surface of the semiconductor substrate, wherein the first thermoelectric generator is coupled to the power supply and the first signal generator, and the first thermoelectric generator is configured to be electrically powered by the power supply on the basis of the first signal, to generate a first thermal gradient;
   a second thermoelectric generator extending along the surface of the semiconductor substrate, wherein the second thermoelectric generator is thermally coupled to the first thermoelectric generator in a manner that the first thermal gradient generated by the first thermoelectric generator causes a second thermal gradient to be generated in the second thermoelectric generator; and
a second integrated circuit, wherein the first integrated circuit and the second integrated circuit are disposed next to each other on the linking device, and wherein the second integrated circuit comprises:
   a second signal generator, configured to generate a second signal on the basis of the second thermal gradient, wherein a logic state of the second signal corresponds to a logic state of the first signal.

19. The system according to claim 18, wherein the interconnect region comprises a plurality of metallic tracks and a plurality of vias, and wherein the plurality of metallic tracks extend over the first thermoelectric generator and between the semiconductor substrate and the first integrated circuit.

20. The system according to claim 18, wherein the first thermoelectric generator comprises a set of thermocouples extending along a surface of the semiconductor substrate.

* * * * *